(12) United States Patent
Lichtenegger et al.

(10) Patent No.: US 8,134,087 B2
(45) Date of Patent: Mar. 13, 2012

(54) ELECTRONIC OR OPTOELECTRONIC ASSEMBLY WITH AN ELECTROMAGNETIC SCREENING STRUCTURE, METHOD FOR MANUFACTURING SAME

(75) Inventors: Thomas Lichtenegger, Alteglofsheim (DE); Stefan Paulus, Zeitlam (DE)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 1159 days.

(21) Appl. No.: 11/938,173

(22) Filed: Nov. 9, 2007

(65) Prior Publication Data
US 2008/0113205 A1 May 15, 2008

(30) Foreign Application Priority Data
Nov. 10, 2006 (DE) .......................... 10 2006 053 982

(51) Int. Cl.
*H05K 9/00* (2006.01)
(52) U.S. Cl. ................ 174/386; 174/394; 174/520
(58) Field of Classification Search .................. 174/386, 174/394, 520; 361/816; 257/680
See application file for complete search history.

(56) References Cited

U.S. PATENT DOCUMENTS

| | | | | |
|---|---|---|---|---|
| 4,604,677 A | * | 8/1986 | Suzuki et al. | 361/729 |
| 7,009,285 B2 | * | 3/2006 | Su et al. | 257/680 |
| 2005/0224092 A1 | * | 10/2005 | Schildmann | 134/1 |
| 2007/0030661 A1 | * | 2/2007 | Morris et al. | 361/818 |

* cited by examiner

*Primary Examiner* — Hung Ngo

(57) ABSTRACT

The invention relates to an electromagnetic screening structure on or in a non-conductive carrier material in which non-conductive metal compounds are placed. The screening structure comprises a flat metal seed layer formed on or in the carrier material, which is formed through metal seeds that have been released through electromagnetic radiation, and a flat metal coating which is applied over the metal seed layer and which is in contact with said metal seed layer. The invention additionally relates to an electronic or optoelectronic used with the screening structure and a method for manufacturing the screening structure. In a further aspect of the invention, an electronic or optoelectronic assembly is provided with a carrier element, wherein at least one additional electrical or optoelectronic component is arranged on the surface of the carrier material and is in contact with conductor path structures formed on the carrier surface.

17 Claims, 4 Drawing Sheets

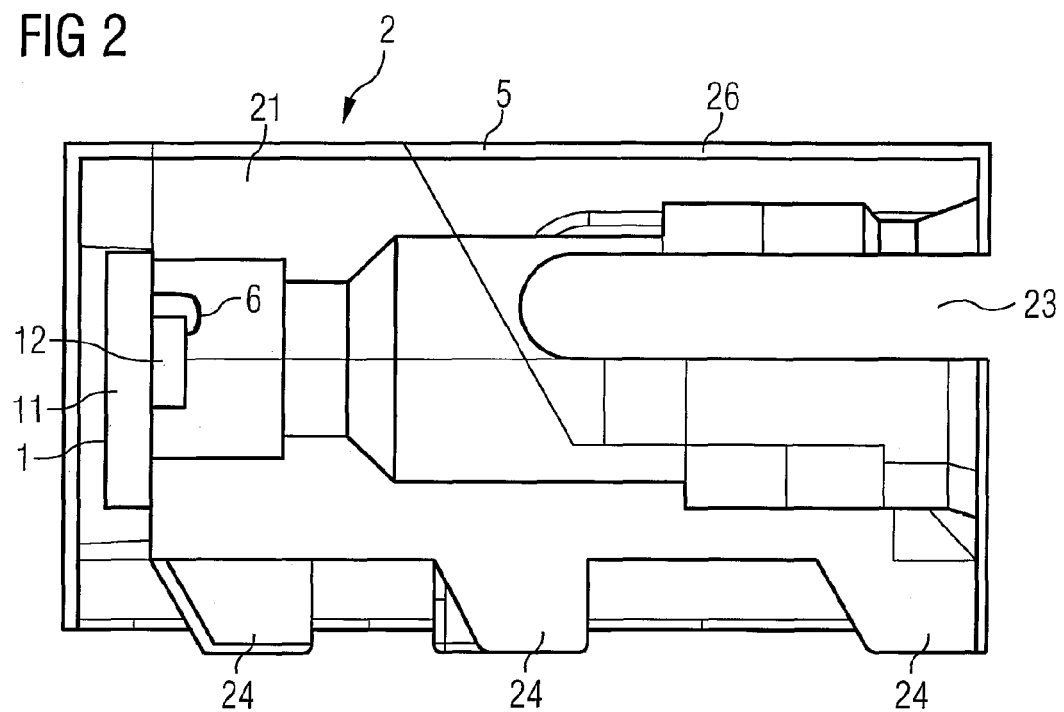
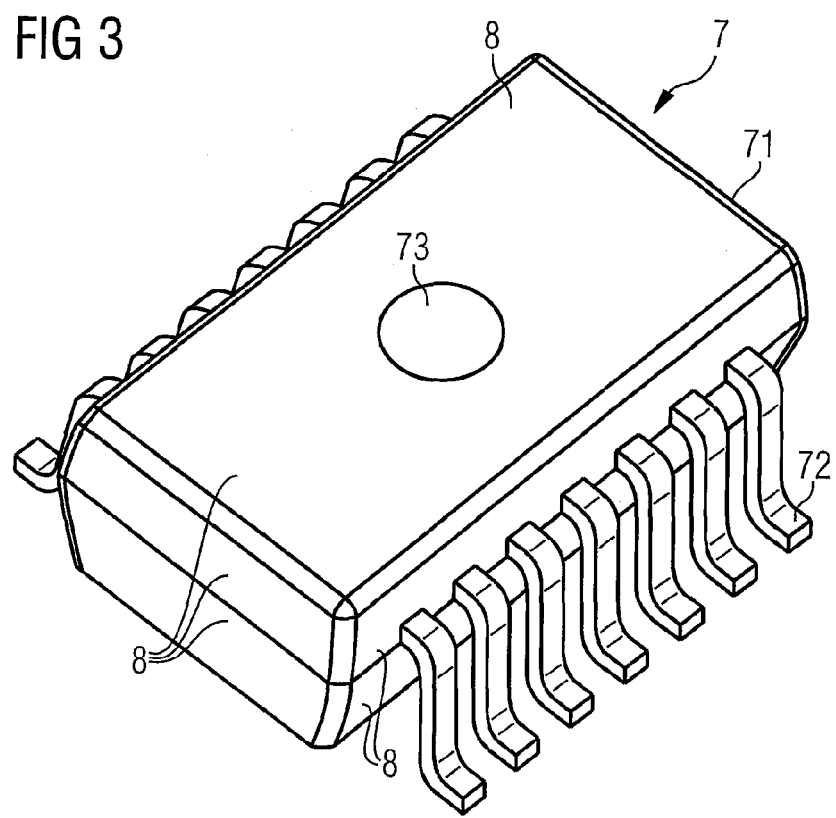

ELECTRONIC OR OPTOELECTRONIC ASSEMBLY WITH AN ELECTROMAGNETIC SCREENING STRUCTURE, METHOD FOR MANUFACTURING SAME

CROSS-REFERENCE TO RELATED APPLICATIONS

This nonprovisional application claims priority to a German application having serial number 10 2006 053 982.6, filed on Nov. 10, 2006, entitled "ELECTROMAGNETIC SCREENING STRUCTURE, ELECTRONIC OR OPTOELECTRONIC ASSEMBLY WITH AN ELECTROMAGNETIC SCREENING STRUCTURE, METHOD FOR THE MANUFACTURE OF ELECTROMAGNETIC SCREENING STRUCTURES AND ELECTRONIC OR OPTOELECTRONIC ASSEMBLY WITH CONDUCTOR PATH STRUCTURES", which incorporated herein by reference in its entirety.

BACKGROUND OF THE INVENTION

The invention relates to an electromagnetic screening structure on a non-conductive substrate material, an electronic or optoelectronic assembly with such a screening structure and a method for the manufacture of electromagnetic screening structures on a non-conductive substrate material. In addition the invention relates to an electronic or optoelectronic assembly with integrated conductor path structures.

"Moulded Interconnect Device (MID)" means a three-dimensional substrate structure for electrical or optoelectronic components with integrated contacting structures and mechanical structures. Integrated contacting structures for example are electrical conductor paths or other electrical wiring structures. Integrated mechanical structures for example are structures for accommodating, orienting and/or fastening a semiconductor component or plug connector structures. MIDs integrate mechanical and electrical functions in one component. As a rule they are manufactured from a thermoplastic material according to the injection moulding method.

The electromagnetic screen of electronic and optoelectronic components is of great importance. Electromagnetic screen makes a component insensitive to interference radiation and the emission of interference radiation also decreases.

Optoelectronic components are known where for the electromagnetic screen a metal coating is applied to the outside of the housing.

In addition methods are known for the manufacture of conductor paths structures on an electrically non-conductive substrate material, in particular an MID, in which non-conductive metal compounds are micro-distributed. Through exposure to laser radiation the metal compounds are broken open in the region of the conductor path structures to be manufactured. A metallisation, which forms the conductor path structures to be manufactured, is applied to the metal seeds that are created in the process. In the regions not exposed to radiation the metal compounds remain unchanged.

There is a need for screening structures that can be easily manufactured, in particular for moulded interconnect devices (MID).

SUMMARY OF THE INVENTION

In a first exemplary embodiment of the present invention an electromagnetic screening structure is provided on or in a non-conductive substrate material, into which non-conductive metal compounds have been included. The screening structure comprises a flat metal seed layer formed on or in the substrate material which is formed by metal seeds released through electromagnetic radiation and a flat metallisation that is applied over the metal seed layer and which is in electrical contact with said metal seed layer.

In a further exemplary embodiment of the present invention a method for the manufacture of such an electromagnetic screening structure on or in a non-conductive substrate material is made available. The method comprises the following steps:

Providing a non-conductive substrate material into which the non-conductive metal compounds have been included, Providing a flat metal seed layer on the substrate material by releasing metal seeds in that the non-conductive metal compounds are exposed to electromagnetic radiation, and Applying a flat metallisation to the flat metal seed layer.

Thereby, the metal seed layer and the metallisation form the screening structure.

Structuring the surface of the substrate material for releasing metal seeds and for providing a flat metal seed layer in one embodiment takes place by means of a laser. During the exposure to or structuring with a laser the laser beam in one embodiment moves along the surface of the substrate material and places structuring lines corresponding to its diameter next to one other. As a result, the flat metal seed layer is gradually created. Outside the laser track no metal seeds are released and the metal compounds there remain non-conductive in the substrate material.

Applying the flat metallisation to the metal seed layer in one development takes place through chemo-reductive metal deposition. Here, the metallisation can have several metal layers which are applied successively.

Suitable laser devices for the direct structuring of surfaces are manufactured by the company LPKF Laser & Electronics AG in 30827 Garbsen and marketed under the designation "MicroLine 3D IR Industrial". Thereby, the laser beam on the one hand activates the non-conductive metal compounds added to the substrate material. In the process, the complex-compounds in the plastic material are broken open. The metal atoms exposed as a result form seeds for subsequent chemo-reductive metallisation. On the other hand the laser creates a micro-rough surface, i.e. the laser ablation creates microscopically small caverns and undercuts in which a metal during the metallisation is able to anchor itself with fixed adhesion. This forms an ideal starting position for subsequent selective chemo-reductive metallisation.

An aspect of the present invention is based on the idea that the methods known in the prior art for realizing connector path structures in a non-conductive substrate material with embedded metal compounds, which utilize the steps of releasing metal seeds through laser structuring and the application of a flat metallisation onto the metal seeds by means of chemo-reductive methods, can find expanded usage, namely for the manufacture and provision of flat electromagnetic screening structures in such a non-conductive substrate material. Here, the realization of flat structures or layers constitutes a new approach.

A flat structure respectively layer means a layer with two-dimensional extension, i.e. with a defined length and width. The flat metal seed layer in one embodiment is manufactured in that a laser beam moves along the surface in question and to this end places multiple structure lines corresponding to its diameter next to one another. The width of the flat layer in this case is equal to a multiple of the width of a structuring line provided by a laser. The flat layer in one development has at least a width which corresponds to the width of more than 10, more preferably more than 100, more preferably more than 1000 of such structuring lines arranged next to one another.

The non-conductive metal compounds in one development are formed by means of inorganic metal compounds or metal chelate complexes. Such non-conductive metal compounds are described for example in DE 101 32 092 A1, in DE 197 23 734 C2 and in DE 197 31 346 C2. To this extent reference is made to these publications. For example the non-conductive metal compounds are copper complexes or palladium complexes. The metallisation can consist of several metal layers, for example nickel, copper and gold (Ni—Cu—Au).

The screening structure in one embodiment is formed on at least one outer wall formed by the substrate material. Alternatively or complementarily the screening structure is formed on at least one inner wall formed by the substrate material. As a result, a screen can be realized directly in the region to be protected, for example adjoining an optoelectronic component.

In a further embodiment the substrate material following the forming of the screening structure is surrounded with additional substrate material or another non-conductive material. This makes possible realizing of screening structures located in the material.

In a further exemplary embodiment of the present invention an electronic or optoelectronic assembly is provided which has at least one electrical or optoelectronic component and one substrate element for the component. Thereby, the substrate element comprises a non-conductive substrate material into which the non-conductive metal compounds have been included, a flat metal seed layer which is formed through metal seeds released by means of electromagnetic radiation and a flat metallisation which is applied over the metal seed layer and which is in electrical contact with said metal seed layer. Thereby, the metal seed layer and the metallisation form an electromagnetic screening structure.

A substrate element in terms of the present invention is any structure which is suitable to mechanically accommodate an electronic or optoelectronic component. In one exemplary embodiment the substrate element is designed as a three-dimensional MID structure, wherein the substrate element in addition to the integration of mechanical function elements has electrical connector paths for electrically contacting the component and in one embodiment additionally integrates plug connections for the coupling of an electrical or optical connector. In another exemplary embodiment the substrate element is a plastic housing consisting of a thermosetting plastic material which contains an electronic or optoelectronic component arranged on an internal circuit board or a leadframe.

In a design of this exemplary embodiment the substrate element has an accommodation aperture for the coupling of an electrical or optical connector. Thereby, the substrate element in one development is formed as a moulded interconnect device (MID). An optoelectronic component of the assembly for example is realized as an optoelectronic sending and/or receiving element.

The non-conductive substrate material can always consist of a thermoplastic or thermosetting plastic material. When forming the substrate element as a MID a thermoplastic synthetic material is generally used. When forming the substrate element by means of a non-transparent housing which for example surrounds components arranged on a leadframe or an internal circuit board, a thermosetting plastic is generally used.

In a further exemplary embodiment of the present invention an electronic or optoelectronic assembly is provided, which comprises at least one first electrical or optoelectronic component, one three-dimensional substrate element for the first component into which the non-conductive metal compounds have been included and which on its surface forms conductor path structures and at least one additional electrical or optoelectronic component, wherein the additional component is arranged on the surface of the substrate element and is contacted by means of the conductor path structures formed on the substrate surface or formed by these.

The further component here preferably belongs to a group that comprises active and passive electrical or electronic components. In particular, the additional component belongs to a group that comprises resistors, capacitors, inductances, diodes, transistors, optoelectronic sending components and optoelectronic receiving components.

The substrate element can always consist of a thermosetting or thermoplastic plastic. In one design the substrate element consists of a thermosetting plastic which represents a housing of the first component.

In addition, the assembly can have an electromagnetic screening structure according to claim 1 which is insulated from the conductor path structures.

BRIEF DESCRIPTION OF THE DRAWINGS

The invention is explained in detail in the following making reference to the figures of the drawings. It is understood that these drawings show only typical embodiments of the invention and must not therefore be considered as limiting their scope.

FIG. 2 shoes an optoelectronic assembly with an MID with a screening structure formed on an outside of the MID;

FIG. 3 shows an optoelectronic component housed in a thermosetting plastic with a screening structure formed on the surface by means of an outside electroless metallisation;

DESCRIPTION OF EXEMPLARY
EMBODIMENTS OF THE INVENTION

Figure 1:
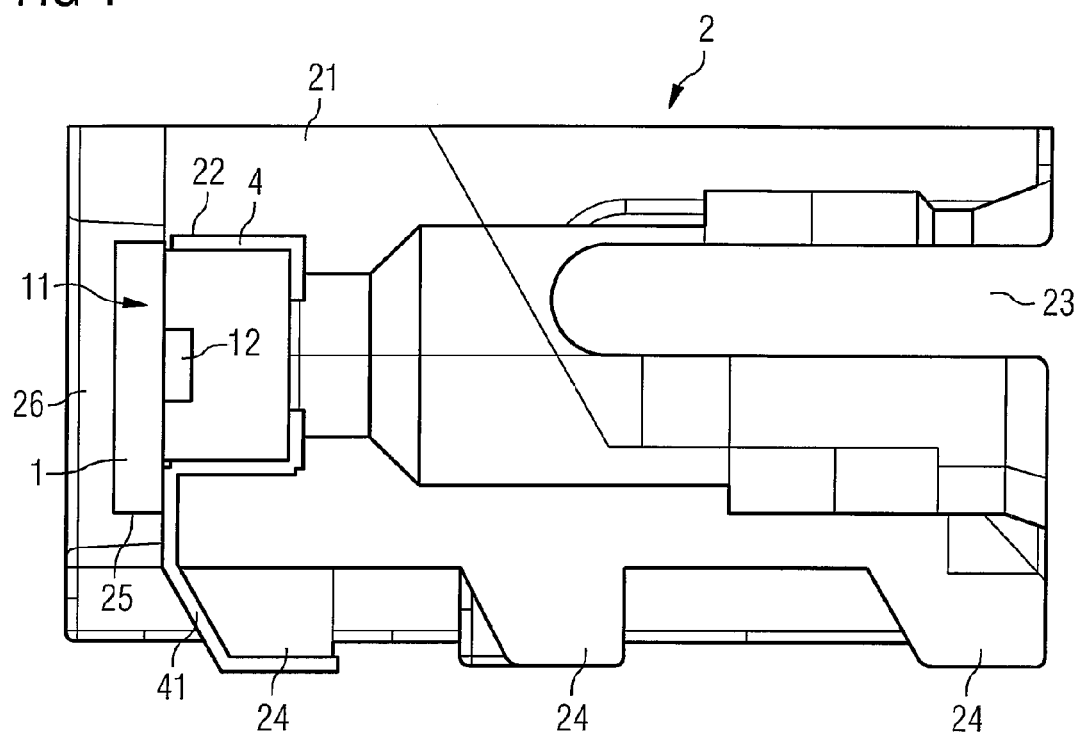
FIG. 1 shows an optoelectronic assembly with a moulded interconnect device (MID) with a screening structure formed on an inner surface of the MID.

FIG. 1 shows an optoelectronic assembly with an optoelectronic submodule 1 and a substrate element 2 formed as MID.

The submodule 1 comprises an application-specific integrated circuit (ASIC) 11, which forms a substrate, on which an optical chip 12 is arranged. The optical chip 12 for example is an optical transmitter for example such as a VCSEL laser diode or an optical receiver such as for example a photodiode. Several, partly redundant laser diodes or photodiodes can also be provided. Additional components of known optoelectronic submodules such as for example monitor diodes can also be provided. The electrical contacting of the optical chip 12 is realized via the substrate 11, for example by means of bonding wires or via a flip-chip mounting.

The MID 2 consists of a thermoplastic, injection-moulded plastic and realizes both mechanical as well as electrical functions. Mechanical functions on the one hand are the accommodation and mechanical coupling of the submodule 1 and on the other hand the provision of an aperture for an optical connector or an optical fibre. It has electrical functions insofar as electrical conductor paths are integrated in the MID which provide electrical contact tracks between contacts of the submodule 1 and contacts of a circuit board on which the assembly is arranged.

Thereby, the submodule 1 is inserted in an end recess 25 of the MID 2. Following fastening and contacting of the submodule 1 the recess 25 is closed through a lid element 26 which for example is created by means of moulding the opening with a plastic or prefabricated.

For the electrical contacting of the submodule 1 on the MID 2 for instance soldering balls can be provided by means of which the submodule 1 is soldered onto contact regions of the conductor paths of the MID 2 integrated in the MID 2. These conductor paths are connected with electrical contacts 24 of the MID via which the assembly can be connected with a circuit board. The individual conductor paths are not shown in FIG. 1.

In addition, the MID 2 has an aperture 23 to accommodate a fibre-optical connector or an optical fibre which is designed as a naked fibre or arranged in a ferrule. The fibre is inserted in the aperture 23 and guided closely to the optical chip 12 where it is fixed.

The MID of FIG. 1 additionally forms an electromagnetic screening structure 4 on an inner wall 22 which in the MID 2 is formed adjoining the optical chip 12. The screening structure 4 is connected with a contact 24 of the MID 2 that is situated on a fixed reference potential via a conductor path 41, which in one development is a GROUND contact. In this manner it is possible by means of applying a screening structure in the region adjoining the optical chip 12 to screen said region electromagnetically. Thereby, suitable inner walls of the MID are metallised here and connected with the GROUND contact. A bonding wire used for high-frequency contacting of the optical chip 12 is thus immune to interference irradiation since the realised screening structure 4 almost provides a Faraday's cage around the optical chip 12. The same applies to the interference radiation of the optical chip 12.

Figure 5:
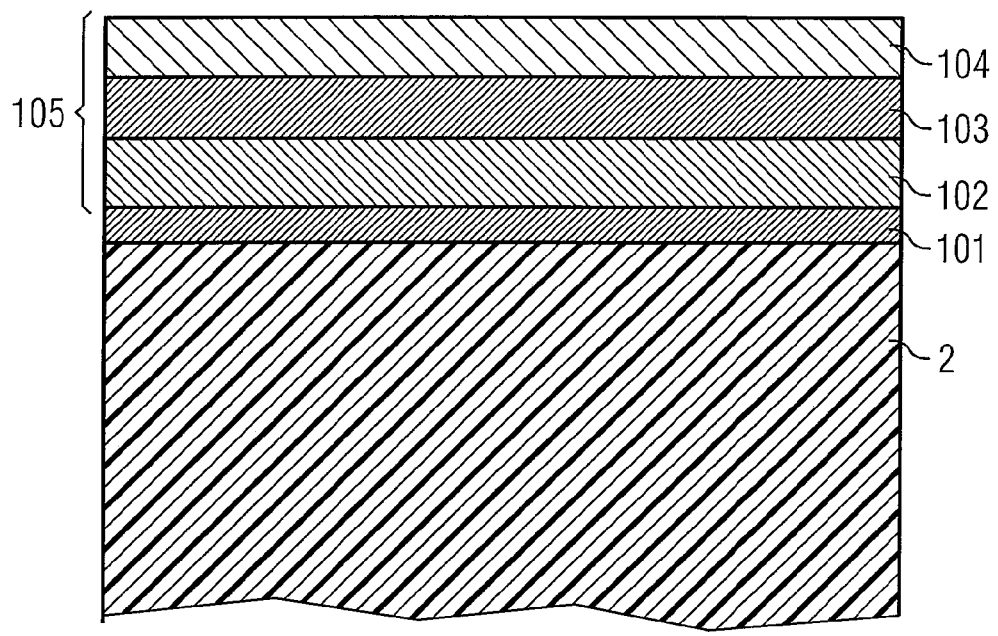
FIG. 5 shows the layer sequence of a screening structure according to the invention.

The screening structure 4 is manufactured by means of currentless metallisation and schematically shown in FIG. 5. Thereby, non-conductive metal compounds, more preferably copper complexes or palladium complexes are introduced in the non-conductive substrate material of the MID 2. Following specific laser radiation exposure these metal complexes release metal seeds and form a flat metal seed layer 101 on the corresponding surface of the substrate material 2. By means of a chemo-reductive metal deposition a flat metallisation 105 is applied to the metal seed layer 101.

The applied metallisation 105 in one embodiment consists of a layer system, more preferably a Cu—Ni—Au layer system. Thereby, a copper layer 102 is initially deposited on the metal seed layer 101. Following micro-etching of the copper layer and a subsequent activation a nickel layer 103 is subsequently deposited for example in a nickel-plating bath containing hypophosphate. A very thin dipped gold layer 104 is then applied as final finish which guarantees optimum soldering and bonding capability.

The method described here, which is also known as outside currentless metallization, is already known for realizing the conductor paths of an MID. According to an aspect of the present invention it is however employed to create screening structures on or in the MID, wherein a flat activation of the substrate material and a subsequent coating of the flat layer for the manufacture of the screening structure takes place.

Here, the subsequent screening structure can be effected in an easy manner during the manufacture of the housing, wherein one additional step of the laser structuring is required to manufacture a flat metal seed layer. The subsequent deposition of the metallisation through chemo-reductive metal deposition can take place in parallel with the plating of the connection contacts 24.

LCP (liquid crystal polymer) for example is used as plastic material.

FIG. 2 shows an exemplary embodiment of an optoelectronic assembly with a submodule 1 and a substrate element 2 formed as MID where a screening structure 5 is formed on the outside of the MID housing.

With regard to the construction of the assembly reference is made to the explanations applicable to FIG. 1. In addition, a bonding wire 6 for contacting the optical chip 12 via the ASIC substrate 11 is shown in FIG. 2.

The difference of the exemplary embodiment of FIG. 2 to the exemplary embodiment of FIG. 1 consists in the forming of the screen. A screen 5 formed on the outer wall 26 of the MID 2 is provided in FIG. 2 which in one development surrounds the entire housing (except for the regions adjoining the electrical contacts 24). The manufacture of the screen is accomplished by means of outside currentless metallization as described with reference to the screen 4 of FIG. 1. Thereby, a large surface of the outside 26 of the MID housing is structured by means of a laser for the purpose of released metal seeds and subsequently metallised in the structured regions in a chemo-reductive metallisation bath.

It is understood that the exemplary embodiments of FIGS. 1 and 2 can also be combined, i.e. screening structures can be formed both on inner walls as well as on outer walls of the MID 2.

In addition, forming of a screening structure on a layer surrounded by the substrate material of the MID 2 can also be provided. To this end, following structuring and deposition of a metallisation, a further plastic layer of a non-conductive substrate material or another plastic material is applied to the screening structure so that said screening structure is located within the MID 2. The MID 2 is thus manufactured for example in a two-stage method wherein initially a first part-body is formed, said part-body is provided with a screening structure and subsequently a second part-body is manufactured. Obviously the MID 2 can also be manufactured in two or multiple stages if the screening structure is formed on an inner and/or outer wall.

FIG. 3 shows an optoelectronic assembly 7, wherein in conventional manner an optical chip (not shown) with additional components such as a laser driver or a pre-amplifier if applicable is arranged on a leadframe (not shown) with a plurality of contact legs 72. The optoelectronic components and the leadframe are embedded with a non-transparent thermosetting plastic which provides the housing 71 of the optoelectronic assembly 7. In the middle, an optical window 73 is formed of a transparent plastic material which enables the light connection or light extraction.

The optoelectronic assembly 7 on its outside—with the exception of the regions about the contact legs 72—is provided with a screening structure 8. The screening structure 8 is manufactured by means of outside currentless metallisation. To this end, the thermosetting plastic material has non-conductive metal compounds, in particular copper complexes or palladium complexes. Following the structuring of large parts of the surface by means of laser and the deposition of a metallisation the screening structure 8 is created.

The manufacturing method thereby is the same as described with regard to FIGS. 1 and 2 with the sole difference that other than in FIGS. 1 and 2 the non-conductive metal compounds are introduced into a thermosetting plastic and not in a thermoplastic as in FIGS. 1 and 2. Non-conductive metal compounds suitable for introduction into a thermosetting plastic are for example described in DE 101 32 092 A1.

Figure 4:
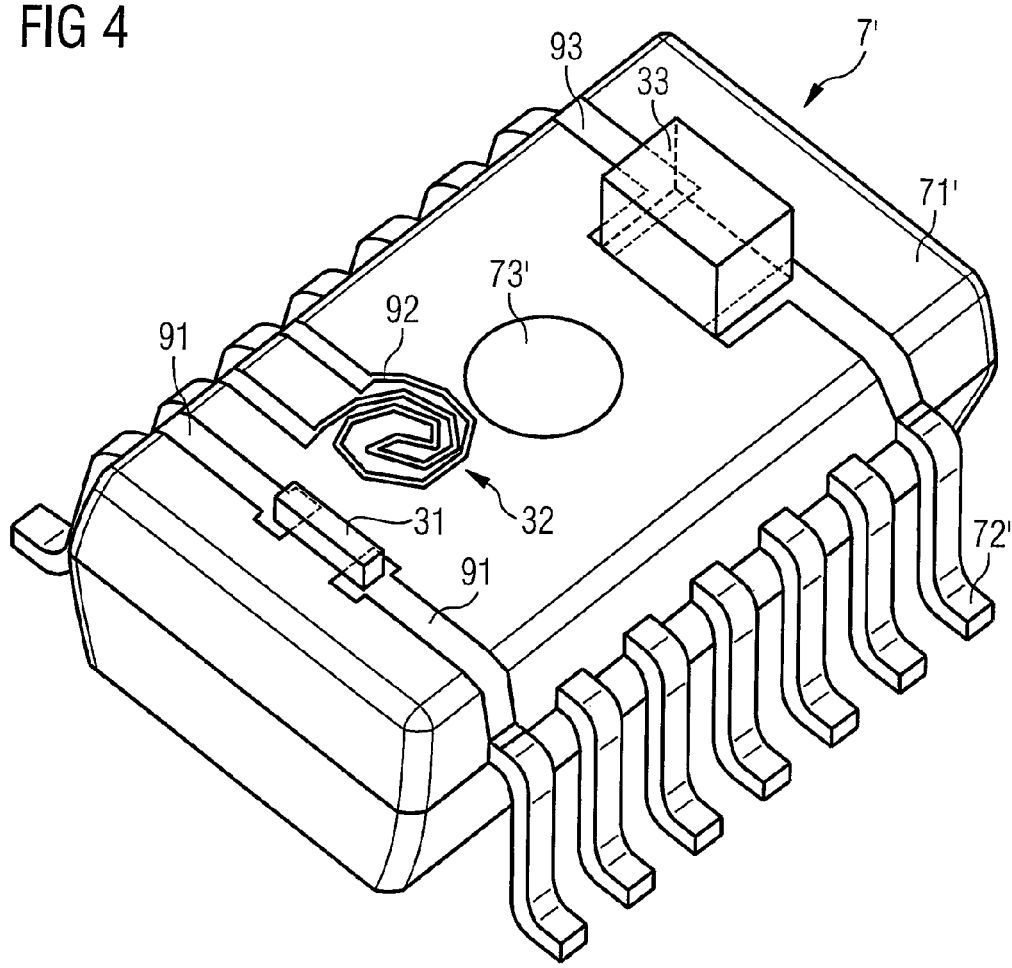
FIG. 4 shows an optoelectronic assembly with a plastic housing which realizes electrical conductor paths on its outside, wherein a further electrical or optoelectronic component is arranged on the surface of the plastic housing and is contacted or formed by means of the conductor paths.

FIG. 4 shows an exemplary embodiment where on an optoelectronic assembly 7' with conductor path structures 91, 92, 93 formed on the surface additional passive or active electrical components in three-dimensional arrangement are arranged on the housing. A greater packing density can be realized in this manner.

Like FIG. 3, FIG. 4 also shows an optoelectronic assembly 7' where an optical chip or another electronic or optoelectronic component is arranged on a leadframe with contact legs 72' led to the outside and moulded in transparent thermosetting plastic 71'. Again an optical window 73' is likewise provided. On the surface of the plastic housing 71' non-flat interconnect structures 91, 92, 93 are formed in this exemplary embodiment which are manufactured through outside currentless metallization as for example described in DE 101 32 092 A1. In the exemplary embodiment of FIG. 4, which must be understood as a schematical and merely as an example, three interconnect structures 91, 92, 93 are provided whereby also only a single one of each of these structures can be provided.

The interconnect structures 91 (consisting of two conductor paths) electrically connected with two contact legs 72' serve for the contacting of a passive electrical component 31, which for example is a resistor. The conductor path structures 92 form a spiral-shaped structure 32 on the surface of the housing 71' which provides a capacitance and an inductance. The conductor path structures 93 (consisting of two conductor paths each connected with a contact leg) serve for the contacting of a component 33 which for example is a diode. It is pointed out that the conductor path structures 91, 93 in the contacting region with the respective component 31, 33 widen into suitably shaped contacting surfaces.

It is also mentioned that the exemplary embodiments of FIGS. 3 and 4 can also be combined. For example it can be provided that in FIG. 4 a screening structure according to FIG. 3 can be realized outside the conductor path structures 91, 92, 93 on the surface of the housing 71'.

It is also pointed out that active or passive electrical components can be mounted on the outside of a housing according to FIG. 4 even when using thermoplastic as housing material.

What is claimed is:

1. An electromagnetic screening structure formed on or in a non-conductive carrier for providing the carrier with electromagnetic shielding, the non-conductive carrier comprising a plastic material having non-conductive metal compounds embedded therein, the electromagnetic screening structure comprising:
   a flat metal seed layer formed on or in the carrier, the flat metal seed layer comprising a plurality of broken open compounds of said non-conductive metal compounds, and wherein metal atoms of the broken open compounds are exposed such that the metal atoms act as seeds of the flat metal seed layer; and
   a flat metal coating that has been applied over the flat metal seed layer and is in electrical contact with said metal seed layer, and wherein the electromagnetic screening structure is electrically coupled to a fixed reference potential.

2. The screening structure according to claim 1, wherein the non-conductive metal compounds comprise inorganic metal compounds or metal chelate complexes.

3. The screening structure according to claim 2, wherein the non-conductive metal compounds comprise copper complexes or palladium complexes.

4. The screening structure according to claim 1, wherein the carrier is a moulded interconnect device.

5. The screening structure according to claim 1, wherein the fixed reference potential is an electric reference GROUND potential.

6. The screening structure according to claim 4, wherein the screening structure is connected with a GROUND contact of the moulded interconnect device to thereby electrically couple the electromagnetic screening structure to the fixed reference potential, and wherein the fixed reference potential is an electric reference GROUND potential.

7. The screening structure according to claim 1, wherein the screening structure is formed on at least one outer wall of the carrier.

8. The screening structure according to claim 1, wherein the screening structure is formed on at least one inner wall of the carrier material.

9. The screening structure according to claim 1, wherein the metal coating comprises a plurality of metal layers.

10. An electronic or optoelectronic assembly comprising:
    at least one electrical or optoelectronic component;
    a carrier element for the component, wherein the carrier element comprises,
       a non-conductive plastic material having non-conductive metal compounds embedded therein,
       a flat metal seed layer formed on or in the carrier element, the flat metal seed layer comprising a plurality of broken open compounds of said non-conductive metal compounds, and wherein metal atoms of the broken open compounds are exposed such that the metal atoms act as seeds of the flat metal seed layer, and
       a flat metal coating which is applied over the metal seed layer and which is in electrical contact with said metal coating,
    and wherein the metal seed layer and the metal coating form an electromagnetic screening structure that provides the carrier element with electromagnetic shielding, and wherein the electromagnetic screening structure is electrically coupled to a fixed reference potential.

11. The assembly according to claim 10, wherein the screening structure is realized on at least one outer wall of the carrier element.

12. The assembly according to claim 10, wherein the screening structure is realized on at least one inner wall of the carrier element.

13. The assembly according to the claim 10, wherein the fixed reference potential is an electric reference GROUND potential, and wherein the screening structure is connected with a GROUND contact of the carrier element to thereby electrically couple the screening structure to the fixed reference potential.

14. The assembly according to claims 10, wherein the carrier element comprises a receptacle opening for the connection of an electrical or optical connector or an optical fibre.

15. The assembly according to claims 10, wherein the optoelectronic component comprises an optoelectronic sending element, an optoelectronic receiving element, or an optoelectronic sending and receiving element.

16. The assembly according to claim 10, wherein the carrier element is formed as a moulded interconnect device.

17. The assembly according to claim 10, wherein the plastic material comprises a thermoplastic or thermosetting plastic.

\* \* \* \* \*